(12) United States Patent
Hong et al.

(10) Patent No.: US 7,882,403 B2
(45) Date of Patent: Feb. 1, 2011

(54) APPARATUS AND METHOD FOR CONTROLLING AN INTERLEAVER/DEINTERLEAVER MEMORY IN A MOBILE COMMUNICATION SYSTEM

(75) Inventors: Seung-Chul Hong, Suwon-si (KR); Jong-Han Lim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1092 days.

(21) Appl. No.: 11/633,424

(22) Filed: Dec. 5, 2006

(65) Prior Publication Data
US 2007/0150775 A1  Jun. 28, 2007

(30) Foreign Application Priority Data
Dec. 5, 2005  (KR) ............... 10-2005-0117730

(51) Int. Cl.
*G06F 11/00* (2006.01)
*H03M 13/00* (2006.01)
(52) U.S. Cl. ................... 714/701; 714/746
(58) Field of Classification Search ........... 714/701, 714/746, 763
See application file for complete search history.

(56) References Cited
U.S. PATENT DOCUMENTS
6,735,723 B2 *  5/2004  Park et al. ............... 714/701
7,773,682 B2 *  8/2010  Hayashi et al. ........... 375/260
2004/0181556 A1  9/2004  Ko et al.

FOREIGN PATENT DOCUMENTS
EP        1 089 439 A1    4/2001
KR   10-2005-0044156 A    5/2005

* cited by examiner

*Primary Examiner*—Shelly A Chase
(74) *Attorney, Agent, or Firm*—Roylance, Abrams, Berdo & Goodman, L.L.P.

(57) ABSTRACT

Provided is an apparatus and method for controlling an interleaver/deinterleaver memory in a mobile communication system are provided. In particular, an apparatus and method are provided which can reduce unnecessary time and power consumption by eliminating an unnecessary memory erasure. A write address generator generates write addresses. A memory stores values mapped to the write addresses. A memory controller controls the memory in which an input signal is accumulated to a value stored at a write address which is then recorded at the write address if the value stored at the write address is recorded for a previous packet when the input signal is generated. The memory controller controls the memory in which the input signal is recorded at the write address if the value stored at the current record address is a valid value for a current packet.

19 Claims, 5 Drawing Sheets

105 — A0,A1,A2,A3,A4,A6,A7,A8,A9,A10,A11,A12,A13,A14,A15 ....

106 — A0,A13,A10,A7,A4,A1,A14,A11,A8,A5,A2,A15,A12,A9,A6,A3 ....

107 — A0,A13,A10,A7,A4,Ae,Ae,Ae,A8,A5,A2,A15,A12,A9,A6,A3 ....

108 — A0,Ae,A2,A3,A4,A5,A6,A7,A8,A9,A10,Ae,A12,A13,Ae,A15 ....

APPARATUS AND METHOD FOR CONTROLLING AN INTERLEAVER/DEINTERLEAVER MEMORY IN A MOBILE COMMUNICATION SYSTEM

CROSS-REFERENCE TO RELATED APPLICATION

This application claims the benefit under 35 U.S.C. §119 (a) to an application entitled "Apparatus and Method for Controlling an Interleaver/Deinterleaver Memory in a Mobile Communication System" filed in the Korean Intellectual Property Office on Dec. 5, 2005 and assigned Serial No. 2005-117730, the entire contents of which is hereby incorporated by reference.

BACKGROUND OF THE INVENTION

1. Field of the Invention

The present invention relates to a mobile communication system. More particularly, the present invention relates to an apparatus and method for controlling an interleaver/deinterleaver memory in a mobile communication system.

2. Description of the Related Art

Mobile communication systems that provide a circuit-based voice service are classified into one of a Frequency Division Multiple Access (FDMA) scheme, Time Division Multiple Access (TDMA) scheme, and Code Division Multiple Access (CDMA) scheme. In the FDMA scheme, a predetermined frequency band is divided into multiple channels with each subscriber being allocated their own frequency channel. In the TDMA scheme, a frequency channel is shared by multiple subscribers with each subscriber being allocated their own time band. In the CDMA scheme, a frequency band and time band is shared by multiple subscribers with each subscriber being allocated their own allocated codes.

With the evolution of communication technologies, mobile communication systems now provide a fast packet data service, which can provide a mobile terminal with not only a conventional voice communication service but also with multimedia services such as e-mail, a still image and a motion image.

Third-generation (3G) mobile communication systems support both conventional voice services and packet services. Exemplary 3G mobile communication systems include synchronous CDMA 2000 1x and 1x Evolution Data Only (1x EV-DO), Evolution of Data and Voice (EV-DV) for supporting high-speed packet transmission and asynchronous Universal Mobile Telecommunications Systems (UMTS).

When a digital signal is transmitted in a mobile communication system, a conventional Viterbi or Reed-Solomon (RS) decoder has excellent error correction capability. However, it is difficult for the decoder to correct continuously occurring burst errors of more than a predetermined size. To address this disadvantage, an interleaver/deinterleaver permutes input signals, thereby distributing the burst errors. Thereby, the decoder can efficiently correct the errors.

FIG. 1A illustrates a structure of a digital transmitter/receiver using a conventional interleaver/deinterleaver and FIG. 1B illustrates exemplary signals from the conventional interleaver/deinterleaver of FIG. 1A.

Referring to FIG. 1A, an encoder 110 of the transmitter attaches additional information to signals or varies a signal form for error correction by the receiver. In FIG. 1B, reference numeral 105 denotes signals encoded by the encoder 110. An interleaver 120 permutes the encoded signals 105. In FIG. 1B, reference numeral 106 denotes signals permuted by the interleaver 120. After passing through the interleaver 120, the signals 106 are affected by an external error or noise and therefore three consecutive errors occur in A1, A14, and A11 as indicated by reference numeral 107. If the number of burst errors capable of being corrected in an encoder/decoder 140 is two, the three consecutive errors cannot be properly corrected. When an interleaver/deinterleaver 130 of the receiver restores the original order of the signals, distorted signals are distributed as indicated by reference numeral 108, such that the decoder 140 can properly correct errors.

FIG. 2 illustrates a structure of the conventional deinterleaver.

The deinterleaver 130 includes a write address generator 220 for generating an address at which an input signal is recorded, a memory 210 for storing the input signal, and a read address generator 230 for generating an address from which data is read on the basis of a deinterleaving rule.

The input signal is sequentially recorded in the memory 210. A valid storage area is set according to the size of a received packet. A start address of the valid storage area is defined as ST_ADDR and an end address is defined as END_ADDR. The write address generator 220 sequentially increments a write address value WD_ADDR by one whenever the input signal is received. When WD_ADDR is more than END_ADDR, WD_ADDR is reset to ST_ADDR, i.e., WD_ADDR=ST_ADDR.

Because a newly received packet is conventionally accumulated and recorded in content at an address WD_ADDR designated by the write address generator 220, a memory write operation by a controller (not illustrated) is simple. When reception of a packet is completed, the controller should erase all content elements of an interleaver/deinterleaver memory at a predetermined time for the next packet reception. However, because a memory erasure is an operation for recording "0" at valid memory addresses, i.e., all memory addresses ranging from ST_ADDR to END_ADDR, time and power are required to access all valid addresses and record "0" at the accessed addresses.

When a size of a packet to be subsequently received is less than that of a packet whose reception is completed, it is advantageous to erase only part of a memory area rather than a total memory area in terms of time and power.

On the other hand, when the size of the packet to be subsequently received is more than that of the packet whose reception is completed, it is advantageous to erase only a memory area used by the completely received packet rather than the total memory area in terms of time and power.

However, the size of the packet to be subsequently received cannot be detected in advance. For this reason, the controller conventionally erases the memory area used by the completely received packet or the total memory area, resulting in unnecessary time and power consumption.

Further, when a time interval between the completely received packet and the packet to be subsequently received is shorter than the memory erasure time, it is difficult to apply a deinterleaving operation.

Accordingly, there is a need for an improved apparatus and method for controlling an interleaver/deinterleaver memory in a mobile communication system.

SUMMARY OF THE INVENTION

Exemplary embodiments of the present invention address at least the above problems and/or disadvantages and provide at least the advantages described below. Accordingly, an aspect of an exemplary embodiment of the present invention is to provide an apparatus and method for controlling an interleaver/deinterleaver memory that can eliminate an unnecessary memory erasure in a memory erasure process when an input signal is written in the interleaver/deinterleaver memory in a mobile communication system.

It is another exemplary aspect of the present invention to provide an apparatus and method for controlling an interleaver/deinterleaver memory that can reduce access to the interleaver/deinterleaver memory in a mobile communication system.

It is yet another exemplary aspect of the present invention to provide an apparatus and method for controlling an interleaver/deinterleaver memory that can reduce power consumption in a mobile communication system.

In accordance with an exemplary aspect of the present invention, there is provided an apparatus for controlling an interleaver/deinterleaver memory in a mobile communication system, comprising: a write address generator for generating write addresses; a memory for storing values mapped to the write addresses; and a memory controller for controlling the memory in which an input signal is accumulated to a value at a write address (WD_ADDR) and is recorded at the write address if a value stored at a current record address is a value recorded in a previous packet when the input signal is generated, and for controlling the memory in which the input signal is recorded in a value at the write address if the value stored at the current record address is a valid value of a current packet.

In accordance with another exemplary aspect of the present invention, there is provided an apparatus for controlling an interleaver/deinterleaver memory in a mobile communication system, comprising: a memory; a read address generator for generating read addresses from which data recorded in the memory is read; and a memory controller for determining whether a read address (RD_ADDR) is equal to or more than a write address (WD_ADDR) when a value stored at a current read address is a valid value of a current packet and for outputting a control signal of "0" to the memory if the read address is equal to or more than the write address.

In accordance with another exemplary aspect of the present invention, there is provided a method for controlling an interleaver/deinterleaver memory in a mobile communication system, comprising the steps of: determining whether a value stored at a current record address is a value recorded in a previous packet or a valid value of a current packet when an input signal is generated; controlling the memory in which the input signal is accumulated to a value at a write address (WD_ADDR) and is recorded at the write address if the value stored at the current record address is the value recorded in the previous packet; and controlling the memory in which the input signal is recorded in a value at the write address if the value stored at the current record address is the valid value of the current packet.

In accordance with yet another exemplary aspect of the present invention, there is provided a method for controlling an interleaver/deinterleaver memory in a mobile communication system, comprising the steps of: determining whether a value stored at a current read address is a value recorded in a previous packet or a valid value of a current packet; determining whether a read address (RD_ADDR) is equal to or more than a write address (WD_ADDR) if the value stored at the current read address is the value recorded in the previous packet; and outputting a control signal of "0" to the memory if the read address is equal to or more than the write address.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain embodiments of the present invention will be more apparent from the following description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figures 1A, 1B:
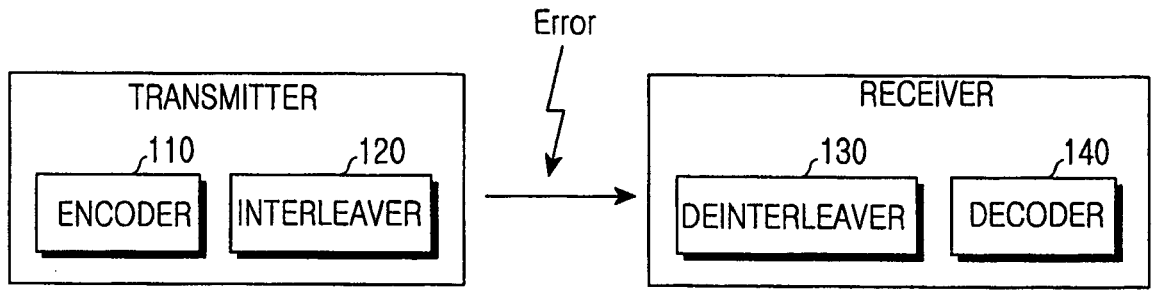
FIG. 1A illustrates a structure of a digital transmitter/receiver using a conventional interleaver/deinterleaver.
FIG. 1B illustrates exemplary signals from the conventional interleaver/deinterleaver of FIG. 1A.
Figure 2:
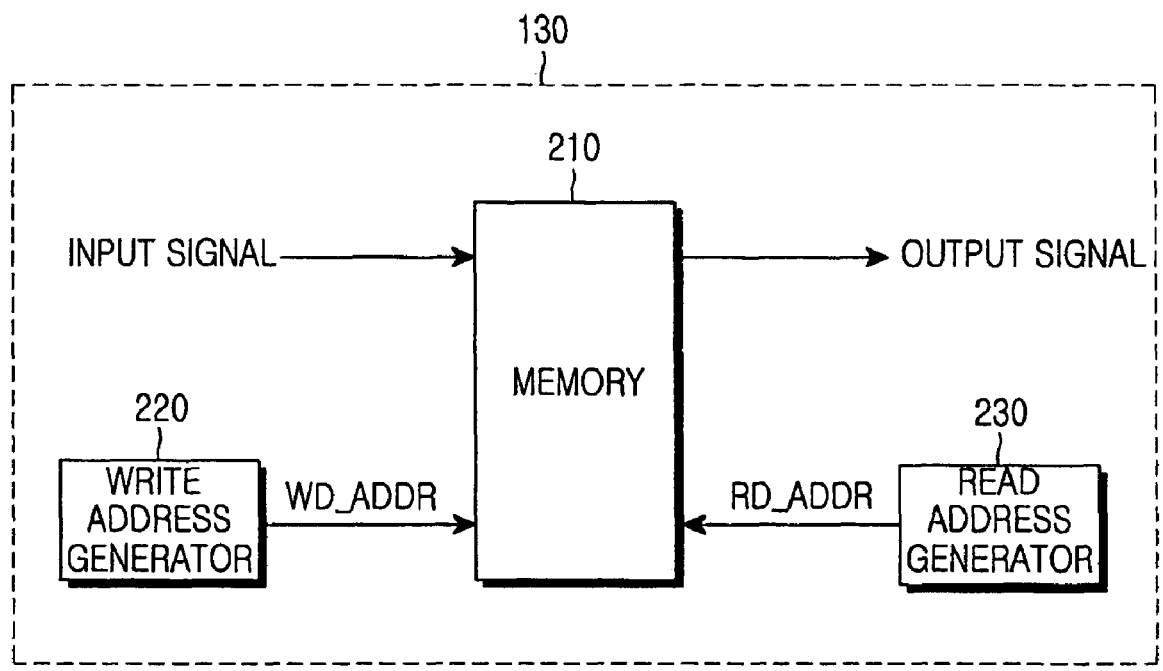
FIG. 2 illustrates a structure of the conventional interleaver/deinterleaver.
Figure 3:
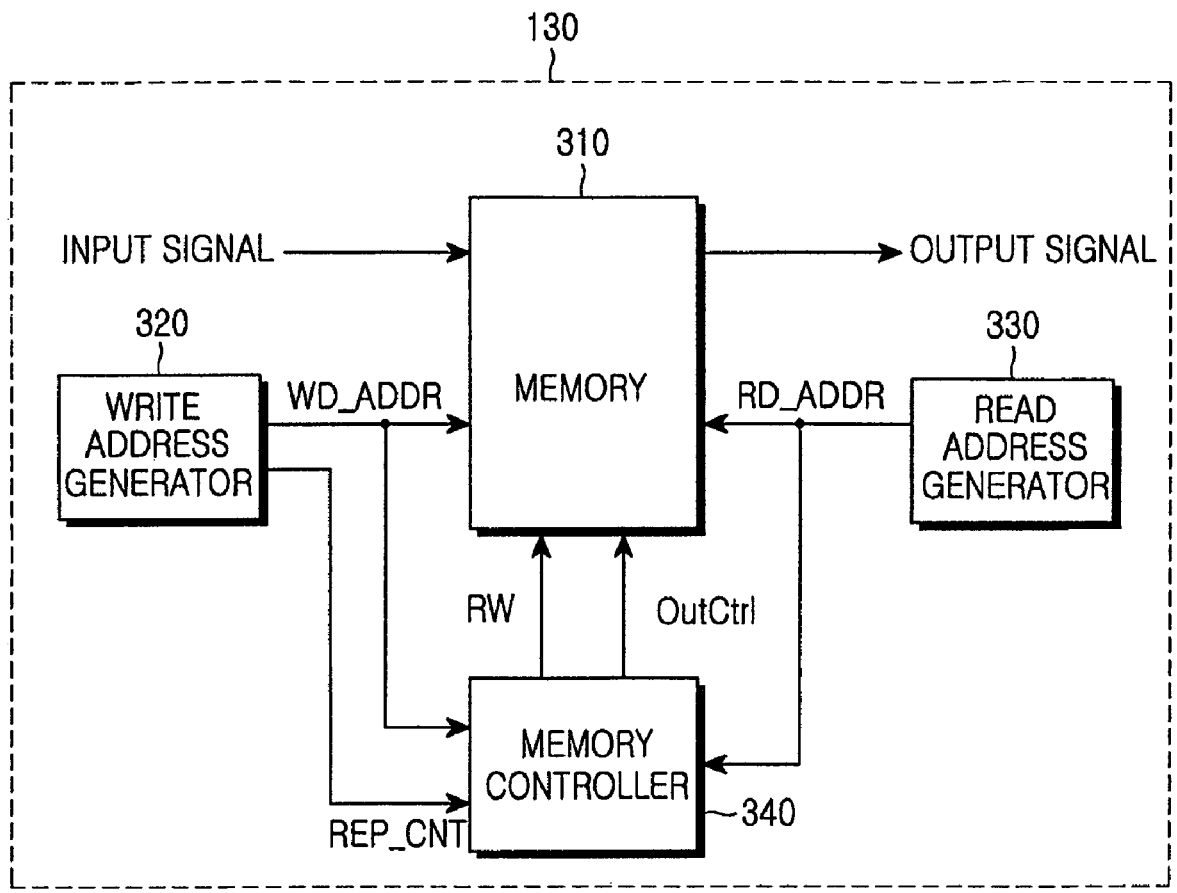
FIG. 3 illustrates a structure of an interleaver/deinterleaver in accordance with an exemplary embodiment of the present invention.

FIG. 3 illustrates a structure of an interleaver/deinterleaver in accordance with an exemplary embodiment of the present invention. Like the interleaver/deinterleaver of FIG. 2, the interleaver/deinterleaver of FIG. 3 includes a memory 310, a write address generator 320, and a read address generator 330. A memory controller 340 for controlling the memory 310 is additionally provided. The write address generator 320 additionally outputs REP_CNT (or REPETITION_COUNTER). REP_CNT is a value indicating whether at least one record has been made in every valid area of the memory 310 and can be expressed as 0 or 1. Before a new packet is received, a new output REP_CNT of the write address generator 320 is reset to 0, i.e., REP_CNT=0. Whenever an input value is present, the write address generator 320 increments a write address value WD_ADDR by one as in the conventional art. When the write address value WD_ADDR exceeds a valid memory address value, the write address generator 320 sets REP_CNT=1 while resetting to a start address value of a memory area. On the other hand, when the write address value WD_ADDR does not exceed the valid memory address value, the write address generator 320 sets REP_CNT=0. That is, the memory controller 340 can determine whether a value stored at a current write address is a value recorded in a previous packet or a valid value of a current packet by referring to a REP_CNT value. The memory controller 340 records an input signal in the memory 310 using an RW signal and controls an output signal of the memory 310 using an OutCtrl signal.

The RW signal indicates a method for recording an input signal in the memory 310. When RW=0, the input signal is stored at a WD_ADDR address of the memory 310. When RW=1, the input signal is accumulated to a value stored at the WD_ADDR address of the memory 310 and the result is then stored at the WD_ADDR address.

The OutCtrl signal controls a memory output value. When OutCtrl=0, an output signal from an RD_ADDR address is "0". When OutCtrl=1, content stored at the RD_ADDR address is output. Herein, the output signal of "0" indicates that input Log Likelihood Ratio (LLR) values of a decoder are set to "0" as in a puncturing process when symbol values read from the memory 310 are used to compute the LLR values to be input to the decoder.

An operation for recording an input signal in the memory 310 will be described with reference to FIG. 4. Here it is assumed that a start address value of a valid area of the memory 310 is ST_ADDR and an end address value is END_ADDR.

It is assumed that a controller (not illustrated) provides the write address generator 320 and the read address generator 330 with information indicating whether a packet is currently being received or whether the received packet is a new packet having a format different from that of a previously received packet or is subsequent to the previously received packet.

Figure 4:
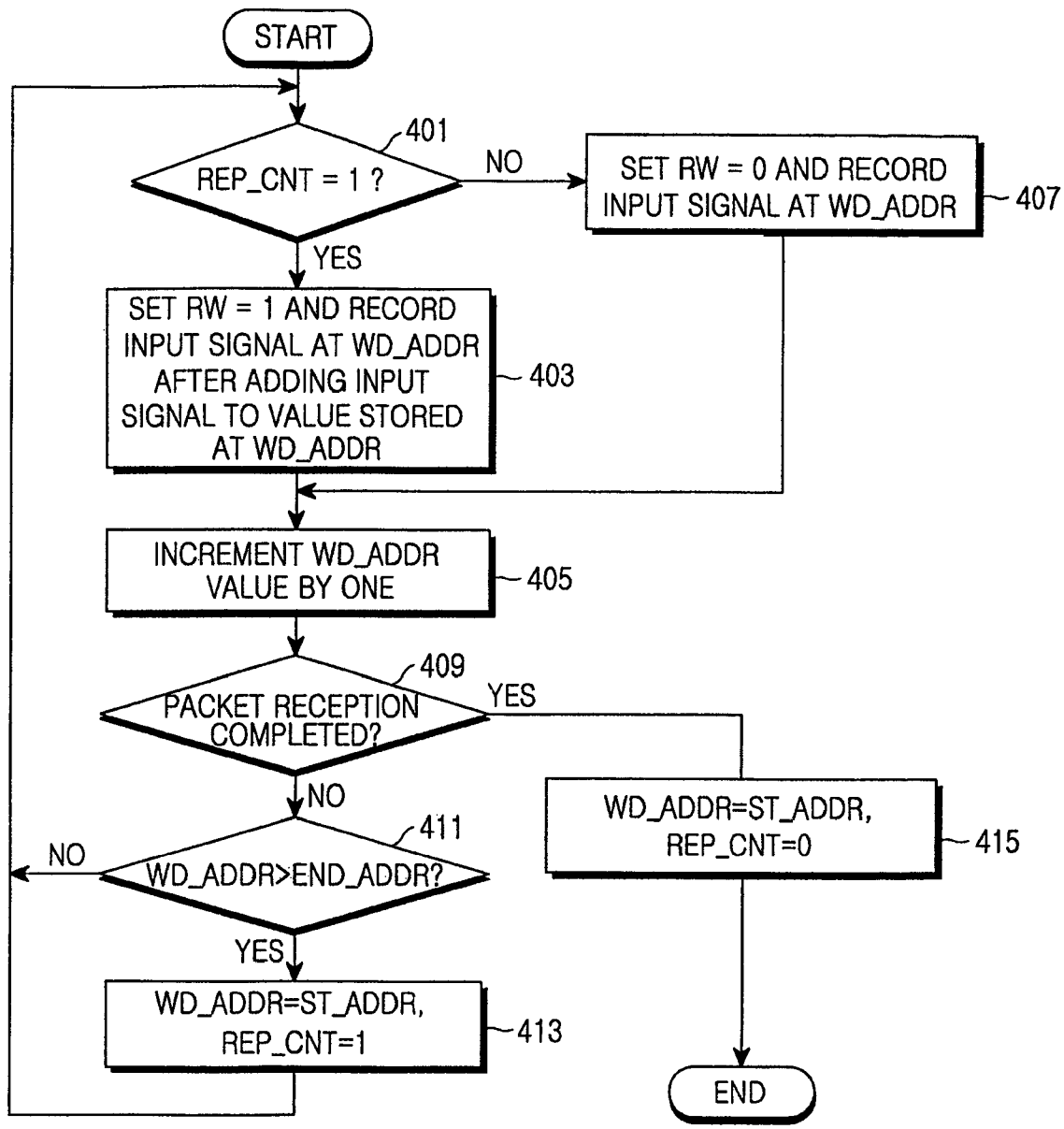
FIG. 4 is a flowchart illustrating a write operation of an interleaver/deinterleaver memory in accordance with an exemplary embodiment of the present invention.

FIG. 4 is a flowchart illustrating a method for controlling an interleaver/deinterleaver memory in a mobile communication system in accordance with an exemplary embodiment of the present invention. That is, FIG. 4 is a flowchart illustrating a write operation of the interleaver/deinterleaver memory.

First, when a new packet begins to be received, the write address generator 320, which receives the packet reception information from the controller (not illustrated), sets WD_ADDR=ST_ADDR and resets REP_CNT=0. Then, whenever an input signal is present, the following operation is repeated.

In step 401, the memory controller 340 determines whether REP_CNT generated from the write address generator 320 is "1". If REP_CNT is "1", the memory controller 340 controls an operation for accumulating the input signal to a value stored at the WD_ADDR address and then recording the input signal at the WD_ADDR address after setting RW=1 and outputting an RW control signal to the memory 310 in step 403. Then, the write address generator 320 increments a WD_ADDR address value of the memory 310 by one in step 405.

However, if REP_CNT is determined not to be "1" in step 401, the memory controller 340 controls an operation for recording the input signal at the WD_ADDR address after setting RW=0 and outputting the RW control signal to the memory 310 in step 407. Then, the write address generator 320 increments the WD_ADDR address value of the memory 310 by one in step 405.

After step 405, the write address generator 320 determines whether a packet reception has been completed using the packet reception information received from the controller (not illustrated) in step 409. If the packet reception has not been completed, the write address generator 320 accesses the memory 310 and determines whether WD_ADDR>END_ADDR in step 411. If WD_ADDR>END_ADDR, i.e., WD_ADDR exceeds a valid memory address value, the write address generator 320 sets WD_ADDR=ST_ADDR and REP_CNT=1 while resetting to a start address value of the memory 310 in step 413. However, if WD_ADDR<=END_ADDR, the operation returns to step 401.

When determining that the packet reception has been completed in step 409, the write address generator 320 sets WD_ADDR=ST_ADDR and REP_CNT=0 in step 415 and ends the operation.

Figure 5:
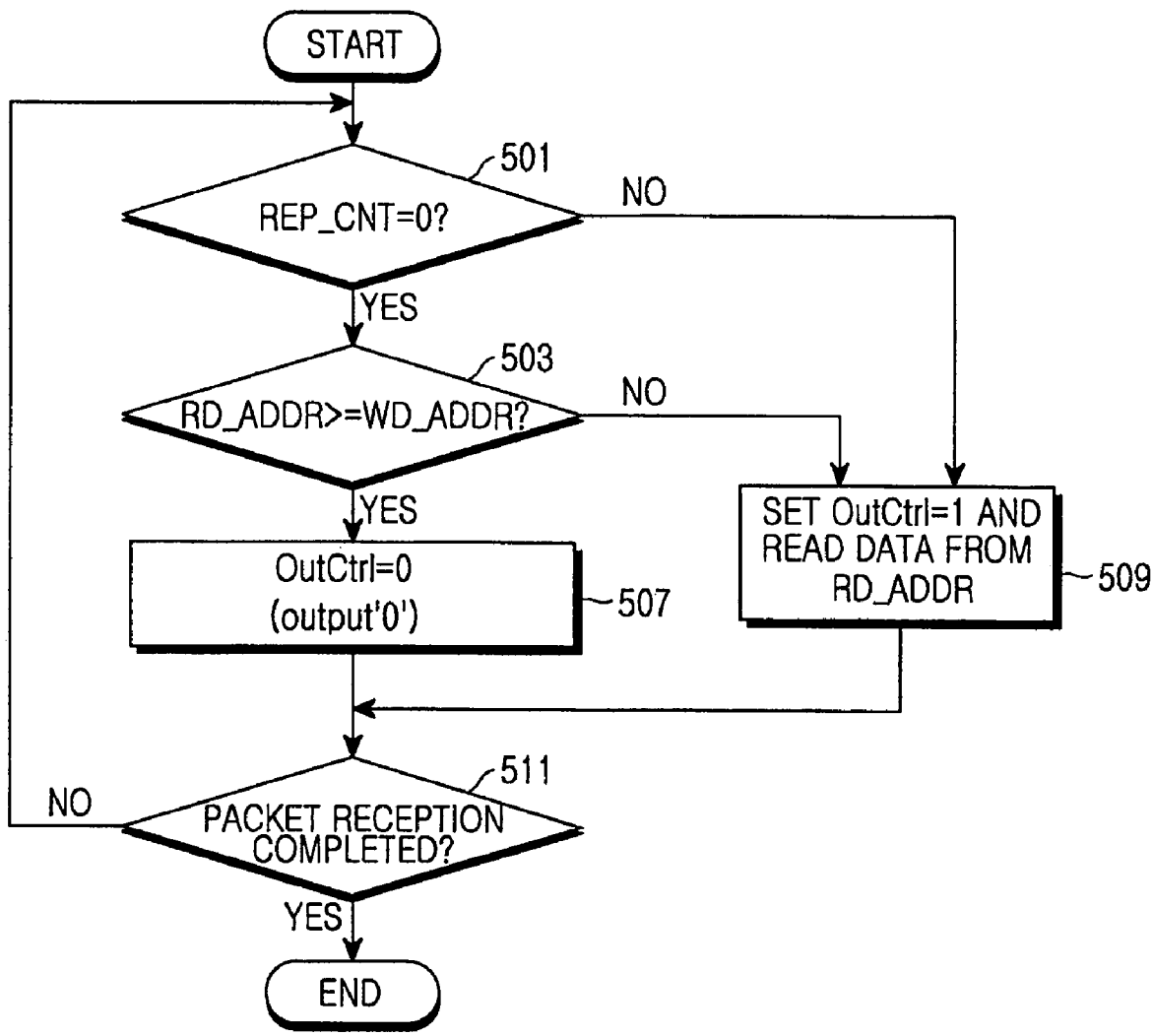
FIG. 5 is a flowchart illustrating a read operation of an interleaver/deinterleaver memory in accordance with another exemplary embodiment of the present invention.

FIG. 5 is a flowchart illustrating a method for controlling an interleaver/deinterleaver memory in a mobile communication system in accordance with another exemplary embodiment of the present invention. That is, FIG. 5 is a flowchart illustrating a read operation of the interleaver/deinterleaver memory.

In FIG. 5, whenever a read request is made, the read address generator 330 outputs RD_ADDR to the memory controller 340 and repeats the following process.

In step 501, the memory controller 340 determines whether REP_CNT generated from the write address generator 320 is "0". If REP_CNT is not "0", the memory controller 340 controls an operation in which the decoder (not illustrated) reads content recorded at the RD_ADDR address after setting OutCtrl=1 and outputting an OutCtrl signal to the memory 310 in step 509.

However, if REP_CNT=0, the memory controller 340 determines whether RD_ADDR>=WD_ADDR using the memory 310 in step 503. If RD_ADDR<WD_ADDR, the memory controller 340 controls an operation in which the decoder (not illustrated) reads content recorded at the RD_ADDR address after setting OutCtrl=1 and outputting the OutCtrl signal to the memory 310 in step 509. However, if RD_ADDR>=WD_ADDR, the memory controller 340 sets the OutCtrl signal to "0" and outputs the signal of "0" from the memory RD_ADDR address in step 507.

After steps 507 and 509, the read address generator 330 determines whether a packet reception has been completed using the packet reception information received from the controller (not illustrated) in step 511. If the packet reception has been completed, the memory controller 340 ends the operation for controlling the interleaver/deinterleaver memory. However, if the packet reception has not been completed, the memory controller 340 returns to step 501.

In the memory control method in accordance with the exemplary embodiment of the present invention, the memory controller 340 determines whether a value stored at a current write address is a previous value or a current valid value by referring to a REP_CNT value when making a record in the memory 310. When reading content of the memory 310, the memory controller 340 determines whether a current RD_ADDR address value is valid by referring to REP_CNT, WD_ADDR and RD_ADDR values. There is an advantage in that power and time consumption due to an additional memory erasure operation can be eliminated because an operation for erasing content of the memory 310 is included in a process for writing content in and reading content from the memory 310.

Because additional time is not required for the memory erasure, an interleaver/deinterleaver operation is not influenced even when a time interval between transmission packets is short.

Exemplary embodiments of the present invention can reduce access to an interleaver/deinterleaver memory, thereby reducing power consumption.

While certain exemplary embodiments of the invention has have been shown and described hereinwith reference to a certain preferred embodiments thereof, it will be understood by those skilled in the art that various changes in form and details may be made therein without departing from the spirit and scope of the invention as defined by the appended claims and their equivalents.

What is claimed is:

1. An apparatus for controlling an interleaver/deinterleaver memory in a mobile communication system, comprising:
   a write address generator for generating write addresses;
   a memory for storing values mapped to the write addresses; and
   a memory controller for controlling the memory in which an input signal is accumulated to a value stored at a write address which is then recorded at the write address if the value was recorded for a previous packet when the input signal was generated, and for controlling the memory in which the input signal is recorded at the write address if the value is a valid value for a current packet.

2. The apparatus of claim 1, wherein the write address generator increments the write address by one when the input signal has been recorded in the memory.

3. The apparatus of claim 1, wherein the write address generator sets the write address to a start address and sets the value stored at the write address to the value recorded in the previous packet, when a packet reception has completed.

4. The apparatus of claim 1, wherein the write address generator determines whether the write address is more than an end address when a packet reception has not completed, and sets the write address to a start address and sets the value stored at the write address to the valid value of the current packet if the write address is more than the end address.

5. The apparatus of claim 1, wherein the memory controller determines whether the value stored at the write address is the value recorded in the previous packet or the valid value of the current packet using a repetition counter output from the write address generator.

6. An apparatus for controlling an interleaver/deinterleaver memory in a mobile communication system, comprising:
a memory;
a read address generator for generating read addresses from which data recorded in the memory is read; and
a memory controller for determining whether a read address is equal to or more than a write address when a value stored at a read address is a valid value of a current packet and for outputting a control signal of "0" to the memory if the read address is equal to or more than the write address.

7. The apparatus of claim 6, wherein the memory controller controls an operation for reading a value from the read address of the memory if the read address is less than the write address.

8. The apparatus of claim 6, wherein the memory controller controls an operation for reading a value from the read address of the memory when the value stored at the read address is a value recorded for a previous packet.

9. The apparatus of claim 6, wherein the memory controller determines whether a value stored at a write address is a value recorded for a previous packet or the valid value of the current packet using a repetition counter output from a write address generator.

10. A method for controlling an interleaver/deinterleaver memory in a mobile communication system, comprising the steps of:
determining whether a value stored at a write address is a value recorded for a previous packet or a valid value for a current packet when an input signal is generated;
controlling the memory in which the input signal is accumulated to a value stored at the write address which is then recorded at the write address if the value was recorded for the previous packet; and
controlling the memory in which the input signal is recorded at the write address if the value stored at the write address is the valid value for the current packet.

11. The method of claim 10, further comprising the step of:
incrementing, by a write address generator, a write address value of the memory by one when the input signal had been recorded in the memory.

12. The method of claim 10, further comprising the steps of:
setting, by a write address generator, the write address to a start address and setting the value stored at the write address to the value recorded for the previous packet, when a packet reception has completed.

13. The method of claim 10, further comprising the steps of:
determining, by a write address generator, whether the write address (WD_ADDR) is more than an end address (END_ADDR) when a packet reception is not completed; and
setting the write address to a start address and setting the value stored at the write address to the valid value of the current packet if the write address is more than the end address.

14. The method of claim 10, further comprising the step of:
determining whether the value stored at the write address is the value recorded for the previous packet or the valid value for the current packet using a repetition counter output from a write address generator.

15. A method for controlling an interleaver/deinterleaver memory in a mobile communication system, comprising the steps of:
determining whether a value stored at a read address is a value recorded for a previous packet or a valid value for a current packet;
determining whether the read address is equal to or more than a write address if the value stored at the read address is the value recorded for the previous packet; and
outputting a control signal of "0" to the memory if the read address is equal to or more than the write address.

16. The method of claim 15, further comprising the step of:
controlling an operation for reading a value from the read address of the memory if the read address is less than the write address.

17. The method of claim 15, further comprising the step of:
controlling an operation for reading the value from the read address of the memory if the value stored at the read address is the value recorded for the previous packet.

18. The method of claim 15, further comprising the step of:
determining whether the value stored at a write address is the value recorded for the previous packet or the valid value for the current packet using a repetition counter output from a write address generator.

19. An apparatus for controlling an interleaver/deinterleaver memory in a mobile communication system, comprising:
a write address generator for generating write addresses;
a memory for storing values mapped to the write addresses;
a read address generator for generating read addresses from which data recorded in the memory is read; and
a memory controller for controlling the memory in which an input signal is accumulated to a value stored at a write address which is then recorded at the write address if the value was recorded for a previous packet when the input signal was generated, for controlling the memory in which the input signal is recorded at the write address if the value is a valid value for a current packet, for determining whether a read address is equal to or more than the write address when a value stored at a read address is a valid value of the current packet, and for outputting a control signal of "0" to the memory if the read address is equal to or more than the write address.

* * * * *